(12) United States Patent
Lee (10) Patent No.: US 12,216,177 B2
(45) Date of Patent: Feb. 4, 2025

(54) MOTOR CONTROL DEVICE AND FAULT DIAGNOSIS METHOD USING SAME

(71) Applicant: LG INNOTEK CO., LTD., Seoul (KR)

(72) Inventor: Jin Seob Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 380 days.

(21) Appl. No.: 17/770,079

(22) PCT Filed: Nov. 4, 2020

(86) PCT No.: PCT/KR2020/015262
§ 371 (c)(1),
(2) Date: Apr. 19, 2022

(87) PCT Pub. No.: WO2021/101131
PCT Pub. Date: May 27, 2021

(65) Prior Publication Data
US 2022/0357412 A1 Nov. 10, 2022

(30) Foreign Application Priority Data
Nov. 18, 2019 (KR) .......................... 10-2019-0147740

(51) Int. Cl.
*G01R 31/52* (2020.01)
(52) U.S. Cl.
CPC .................... *G01R 31/52* (2020.01)
(58) Field of Classification Search
CPC ..... F02D 41/221; F02D 19/025; G01R 31/50; G01R 31/52; G01R 31/34; G01R 31/54; H02P 29/00
See application file for complete search history.

(56) References Cited

U.S. PATENT DOCUMENTS

| | | | | |
|---|---|---|---|---|
| 10,793,017 | B2* | 10/2020 | Lee | G01R 31/00 |
| 2016/0003885 | A1* | 1/2016 | Loke | G01D 3/08 |
| | | | | 324/543 |
| 2019/0285685 | A1* | 9/2019 | Braun | G01R 31/54 |

FOREIGN PATENT DOCUMENTS

| | | |
|---|---|---|
| JP | 2008-051722 | 3/2008 |
| JP | 2011-010190 | 1/2011 |

(Continued)

OTHER PUBLICATIONS

International Search Report dated Feb. 18, 2021 issued in Application No. PCT/KR2020/015262.

*Primary Examiner* — Jared Fureman
*Assistant Examiner* — Nicolas Bellido
(74) *Attorney, Agent, or Firm* — KED & ASSOCIATES, LLP (57) ABSTRACT

Disclosed according to embodiments are a motor control device and a fault diagnosis method using the same. The motor control device includes a first reception circuit which receives a first input signal through a first signal line, a second reception circuit which receives a second input signal through a second signal line, a sensing circuit which is connected to the first signal line and the second signal line and outputs a state output value which varies according to whether the second signal line is opened, and a micro control unit (MCU) which receives the state output value output from the sensing circuit and determines whether the second signal line is opened using the received state output value.

9 Claims, 8 Drawing Sheets

(56) References Cited

FOREIGN PATENT DOCUMENTS

| | | | |
|---|---|---|---|
| JP | 5387170 B2 | * | 1/2014 |
| JP | 2015-179025 | | 10/2015 |
| KR | 10-0717303 | | 5/2007 |
| KR | 10-1469435 | | 12/2014 |

* cited by examiner

MOTOR CONTROL DEVICE AND FAULT DIAGNOSIS METHOD USING SAME

CROSS-REFERENCE TO RELATED PATENT APPLICATIONS

This application is a U.S. National Stage Application under 35 U.S.C. § 371 of PCT Application No. PCT/KR2020/015262, filed Nov. 4, 2020, which claims priority to Korean Patent Application No. 10-2019-0147740, filed Nov. 18, 2019, whose entire disclosures are hereby incorporated by reference.

TECHNICAL FIELD

The present invention relates to a motor control device and a fault diagnosis method using the same.

BACKGROUND ART

A motor installed in a vehicle can be used as a driving source which rotates a sensor device, such as a light detection and ranging (LiDAR). Normal driving of a motor can be an important factor to secure the performance of a sensor device.

In a process of applying an operation signal to operate a motor, a problem that noise is generated or an input signal line is opened can occur, and thus an input signal cannot be transmitted normally.

Since an operation mode of a motor is determined according to an input signal, when an input signal is not transmitted normally, malfunction of the motor can occur. Particularly, when an input signal line is opened, and an input signal is not transmitted normally, although a fault treatment should be performed, a treatment for a state in which a normal voltage is input can also be performed.

Accordingly, a method of accurately detecting an open state of an input signal line is required.

DISCLOSURE

Technical Problem

The present invention is directed to providing a motor control device and a fault diagnosis method using the same.

Technical Solution

One aspect of the present invention provides a motor control device including a first reception circuit which receives a first input signal through a first signal line, a second reception circuit which receives a second input signal through a second signal line, a sensing circuit which is connected to the first signal line and the second signal line and outputs a state output value which varies according to whether the second signal line is opened, and a micro control unit (MCU) which receives the state output value output from the sensing circuit and determines whether the second signal line is opened using the received state output value.

The sensing circuit may be not connected to the first signal line when the second signal line is opened and may output "0" as the state output value, and may be connected to the first signal line when the second signal line is not opened and may output "1" as the state output value.

The sensing circuit may include an n-channel metal oxide semiconductor field effect transistor (MOSFET), a gate of the n-channel MOSFET may be connected to the second signal line, and a source of the n-channel MOSFET may be connected to the first signal line.

The sensing circuit may include a first sensing circuit which is connected to the first signal line and the second signal line and outputs a state output value which varies according to whether the second signal line is opened and a second sensing circuit which is connected to the first signal line and the second signal line and outputs a state output value which varies according to whether the first signal line is opened.

The sensing circuit may include a first sensing circuit which is connected to the first signal line and the second signal line and outputs a state output value which varies according to whether the second signal line is opened and a second sensing circuit which is connected to the first signal line and the second signal line and outputs a comparison output value between the first input signal and the second input signal.

The second sensing circuit may output "0" or a value within a predetermined error range as the comparison output value when both the first input signal and the second input signal are normal signals, and a value other than "0" or a value beyond the predetermined error range as the comparison output value when the first input signal or the second input signal is an abnormal signal.

The second sensing circuit may include an inverting amplifier, the first signal line may be connected to an inverting input terminal of the inverting amplifier, the second signal line may be connected to a non-inverting input terminal of the inverting amplifier, and the second sensing circuit may output the comparison output value between the first input signal and the second input signal.

The sensing circuit may include a first sensing circuit which is connected to the first signal line and the second signal line and outputs a state output value which varies according to whether the second signal line is opened, a second sensing circuit which is connected to the first signal line and the second signal line and outputs a state output value which varies according to whether the first signal line is opened, and third sensing circuit which is connected to the first signal line and the second signal line and outputs a comparison output value between the first input signal and the second input signal.

The first input signal may be a voltage signal for waking the MCU up, and the second input signal may be a voltage signal for controlling a speed of a driving motor.

Another aspect of the present invention provides a fault diagnosis method of a motor control device including outputting a state output value, which varies according to whether a second signal line is opened, from a circuit connected to a first signal line and a second signal line to which a first input signal and a second input signal are applied, outputting a comparison output value between the first input signal and the second input signal from the circuit connected to the first signal line and the second signal line, determining whether the second signal line is opened using the output state output value, and determining whether the first input signal or the second input signal is abnormal using the output comparison output value.

In the determining, when the state output value is "0," it may be determined that the second signal line is in an open state.

In the determining, when the state output value is "1," it may be determined that the second signal line is in a normal state, and it may be checked that the comparison output value is "0" or within a predetermined error range.

In the determining, when the comparison output value is not "0" or is beyond the predetermined error range, it may be determined that the first input signal or the second input signal is an abnormal signal.

Advantageous Effects

According to embodiments, since a sensing circuit is disposed between and connected to two input lines through which two input signals are transmitted between an electronic control unit (ECU) and a motor control device, and values transmitted through the input lines are checked, whether the input lines are opened can be accurately detected.

According to the embodiments, since the sensing circuit is disposed between and connected to two the input lines through which two input signals are transmitted, and a comparison output value between the two input signals is checked, whether the input signals are abnormal can be detected.

According to the embodiments, the present invention can be used as a safety mechanism to determine an error of two signals.

MODES OF THE INVENTION

Hereinafter, exemplary embodiments of the present invention will be described in detail with reference to the accompanying drawings.

However, the technical spirit of the present invention is not limited to the few embodiments which will be described and may be embodied in a variety of different forms, and at least one or more components of the embodiments may be selectively combined, substituted, and used within the range of the technical spirit.

In addition, unless clearly and specifically defined otherwise by the context, all terms (including technical and scientific terms) used herein can be interpreted as having meanings customarily understood by those skilled in the art, and meanings of generally used terms, such as those defined in commonly used dictionaries, will be interpreted in consideration of contextual meanings of the related art.

In addition, the terms used in the embodiments of the present invention are considered in a descriptive sense only and not to limit the present invention.

In the present specification, unless clearly indicated otherwise by the context, singular forms include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and the essence, order, and the like of the elements are not limited by the terms.

In addition, it should be understood that, when an element is referred to as being "connected" or "coupled" to another element, such a description may include both a case in which the element is directly connected or coupled to another element, and a case in which the element is connected or coupled to another element with still another element disposed therebetween.

In addition, when any one element is described as being formed or disposed "on" or "under" another element, such a description includes both a case in which the two elements are formed or disposed in direct contact with each other and a case in which one or more other elements are interposed between the two elements. In addition, when one element is described as being formed "on or under" another element, such a description may include a case in which the one element is formed at an upper side or a lower side with respect to another element.

In embodiments, a new method is proposed in which a sensing circuit is disposed between and connected to two input lines through which two input signals are transmitted between an electronic control unit (ECU) and a motor control device, and whether the input lines are opened or whether the input signals are abnormal is checked through the sensing circuit.

Figure 1:
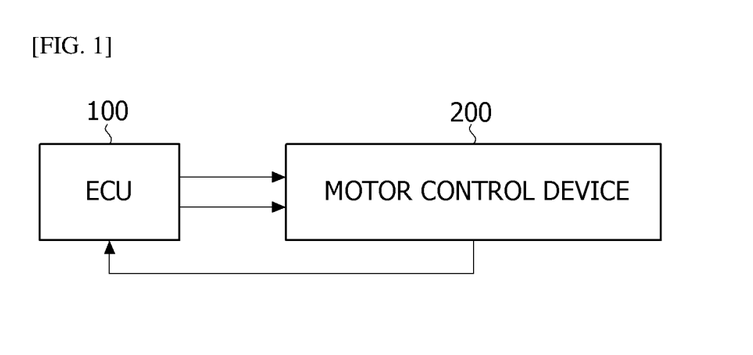
FIG. 1 is a view illustrating a system for fault diagnosis according to one embodiment of the present invention.

FIG. 1 is a view illustrating a system for fault diagnosis according to one embodiment of the present invention.

Referring to FIG. 1, the system for fault diagnosis according to one embodiment of the present invention may include an ECU 100 and a motor control device 200.

The ECU 100 may provide input signals in order to control a driving motor. The ECU 100 may provide a first input signal and a second input signal to a motor control device in order to control the driving motor. In this case, the first input signal may be a signal for waking the motor control device up, and the second input signal may be a signal for controlling a speed of the driving motor.

The motor control device 200 may receive the input signals from the ECU 100 and control the driving motor, for example, a speed of the driving motor, on the basis of the input signals.

The motor control device 200 may receive the first input signal through a first input line and the second input signal through a second input line. When the motor control device 200 determines that the first input line or the second input line is opened or the first input signal or the second input signal is an abnormal signal, the motor control device 200 may provide an error signal to the ECU 100.

Figure 2:
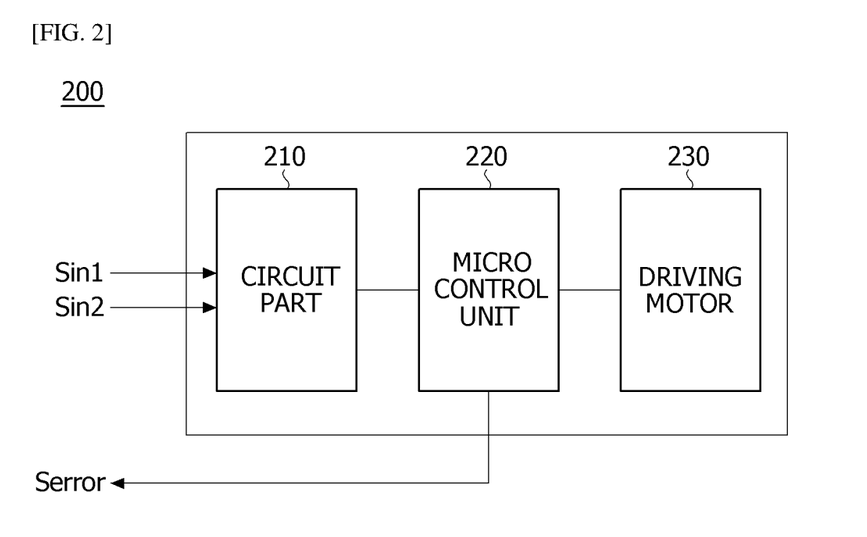
FIG. 2 is a view illustrating a motor control device according to one embodiment of the present invention.

FIG. 2 is a view illustrating the motor control device according to one embodiment of the present invention.

Referring to FIG. 2, the motor control device 200 according to one embodiment of the present invention may include a circuit part 210, a micro control unit (MCU) 220, and a driving motor 230.

The circuit part 210 may receive a first input signal Sin1 and a second input signal Sin2 from the ECU through the different signal lines.

Figure 3:
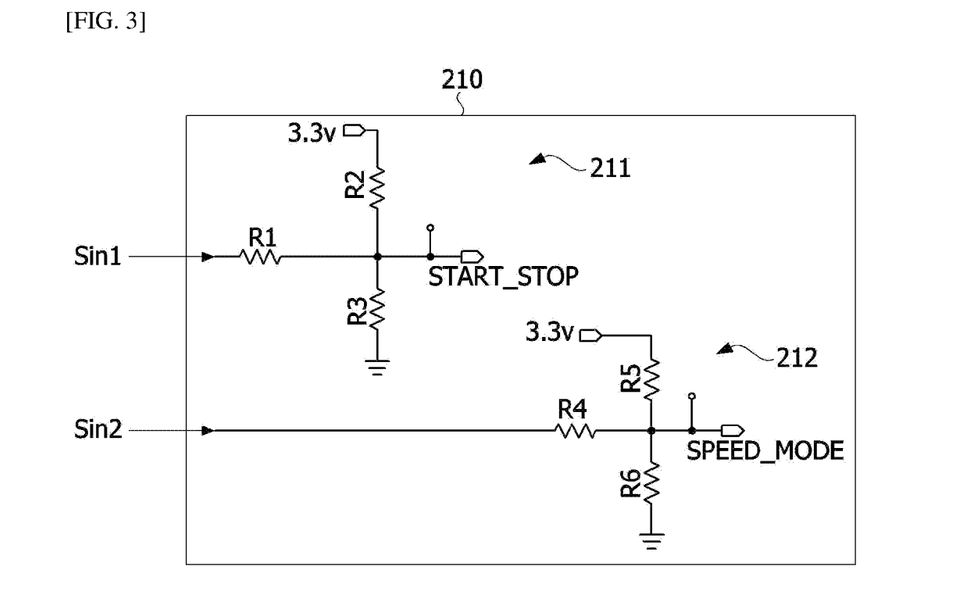
FIG. 3 is a view for describing an actually implemented circuit of a conventional circuit part.
Figure 4A:
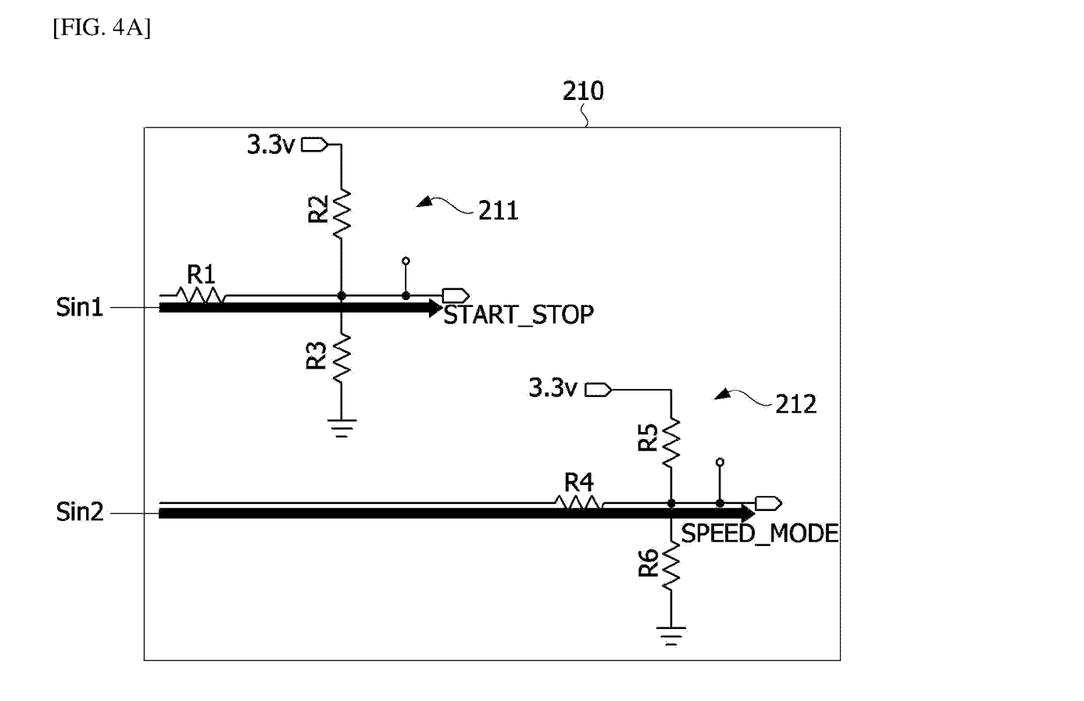
FIGS. 4A and 4B are views for describing an operation principle of the conventional circuit part illustrated in FIG. 3.
Figure 4B:
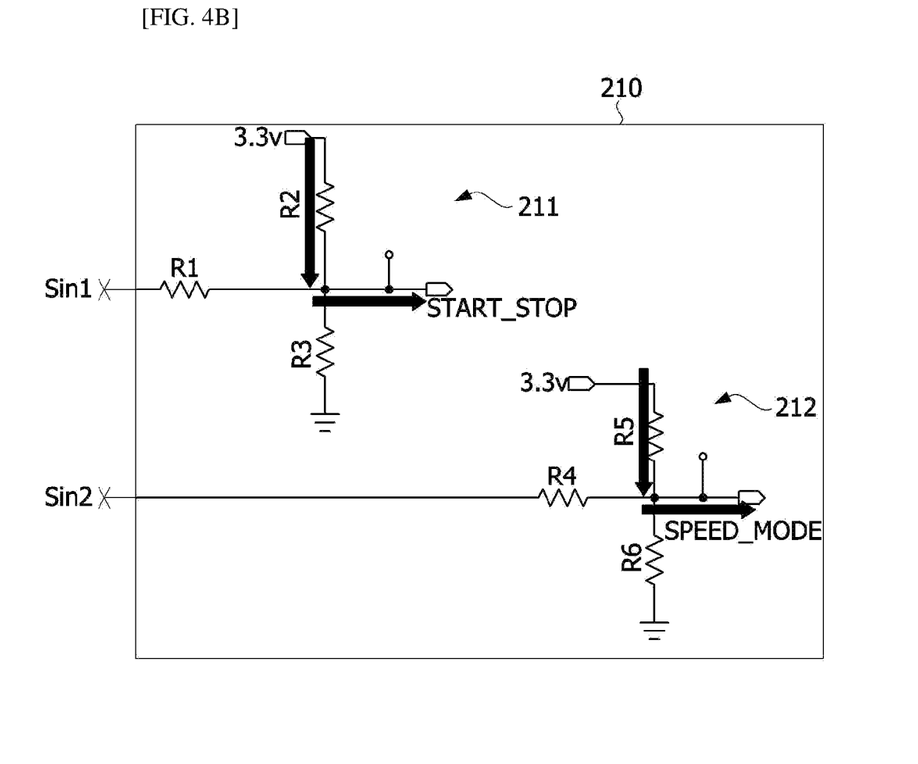

FIG. 3 is a view for describing an actually implemented circuit of a conventional circuit part, and FIGS. 4A and 4B are views for describing an operation principle of the conventional circuit part illustrated in FIG. 3.

Referring to FIG. 3, a circuit part 210 according to an embodiment may include a first reception circuit 211 and a second reception circuit 212. When input signals with specific voltages are input to the first reception circuit 211 and the second reception circuit 212, the input signals with the specific voltages may be transmitted to an MCU through a terminal START_STOP and a terminal SPEED MODE.

The first reception circuit 211 may include a first resistor R1, a second resistor R2, and a third resistor R3, the first resistor connected to a first signal line in series may serve to remove noise of a first input signal, and the first reception circuit 211 may include the second resistor and the third resistor which are disposed between and connected to the first resistor and an output terminal in parallel. The second resistor is a pull up resistor, a power terminal is connected to one end of the second resistor, and the third resistor serves to divide a voltage supplied through the power terminal along with the second resistor.

The second reception circuit 212 may include a fourth resistor R4, a fifth resistor R5, and a sixth resistor R6, the fourth resistor connected to a second signal line in series may serve to remove noise of the second input signal, and the second reception circuit 212 may include the fifth resistor and the sixth resistor which are disposed between and connected to the fourth resistor and an output terminal in parallel. The fifth resistor is a pull up resistor, a power terminal is connected to one end of the fifth resistor, and the sixth resistor serves to divide a voltage supplied from the power terminal along with the fifth resistor.

Referring to FIG. 4A, in a normal operation, the first reception circuit may transmit a first input signal at 3.3 V through the first signal line, and the second reception circuit 212 may transmit a second input signal at 3.3 V through the second signal line.

Referring to FIG. 4A, when the signal line is opened, the first reception circuit may divide the voltage applied from the power terminal at 3.3 V and transmit a voltage of 2.72 V, and the second reception circuit may divide the voltage applied from the power terminal at 3.3 V and transmit a voltage of 2.72 V.

When the voltage of 2.72 V is transmitted to the MCU through the first reception circuit or the second reception circuit, the MCU may recognize that the corresponding signal line is in an open state and transmit error information to an ECU for failure management.

As described above, conventionally, when a voltage of 2.72 V is detected as a voltage of an input signal instead of a voltage of 3.3 V which is a reference voltage, it is recognized that a signal line is opened, but when a voltage of 2.72 V of a real input signal is input, the MCU recognizes that the signal line is opened even when the signal line is not opened.

With only the configuration of the conventional circuit part, it cannot be determined whether a signal at a voltage of 2.72 V is input when a signal line is really opened or whether a real input voltage is 2.72 V. That is, there is no mechanism capable of notifying of a difference after checking the difference in level between two signals.

Figure 5:
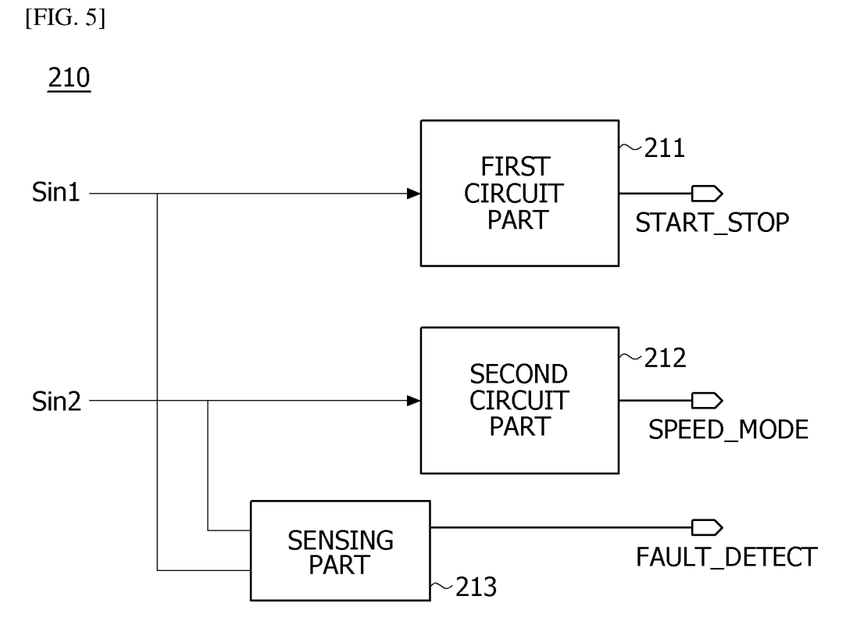
FIG. 5 is a view illustrating a configuration of a circuit part according to one embodiment of the present invention.
Figure 6A:
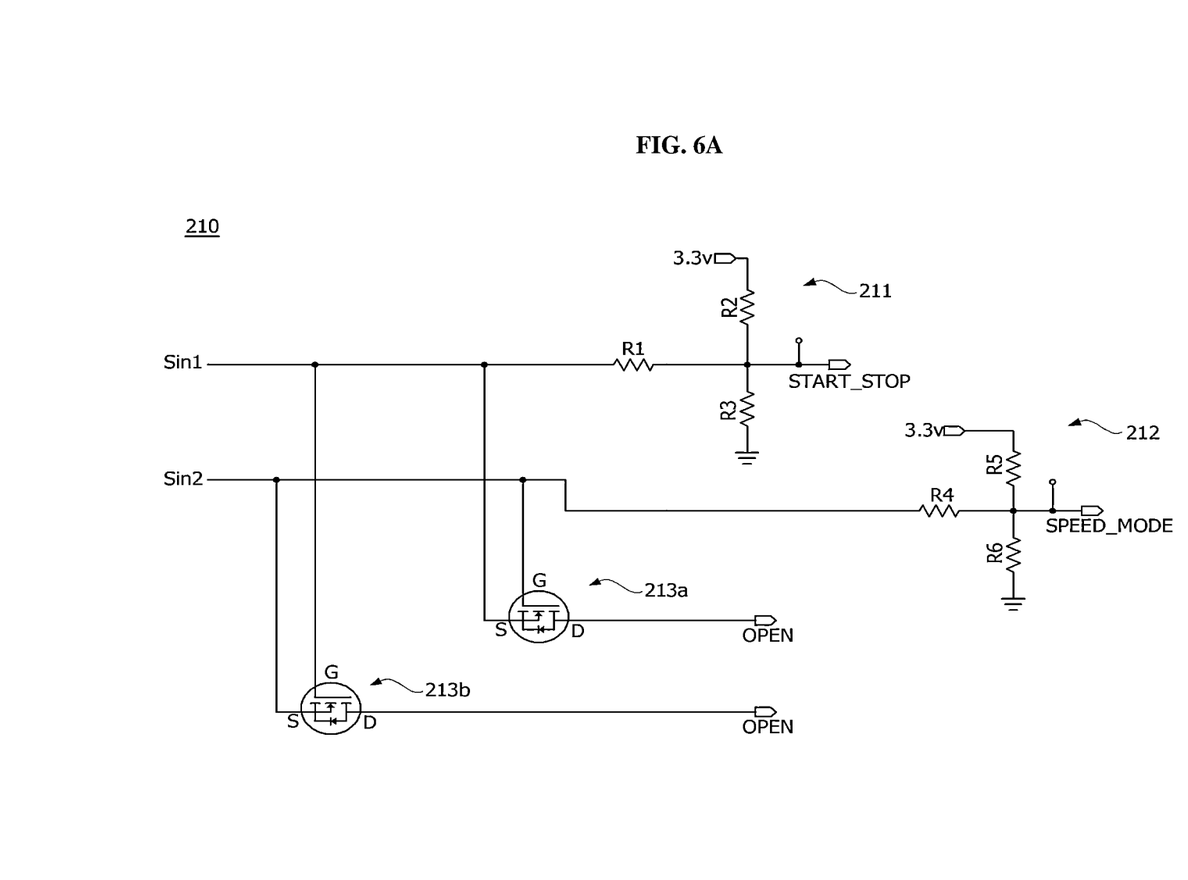
FIGS. 6A to 6C are views for describing a circuit in which the circuit part illustrated in FIG. 5 is implemented.
Figure 6B:
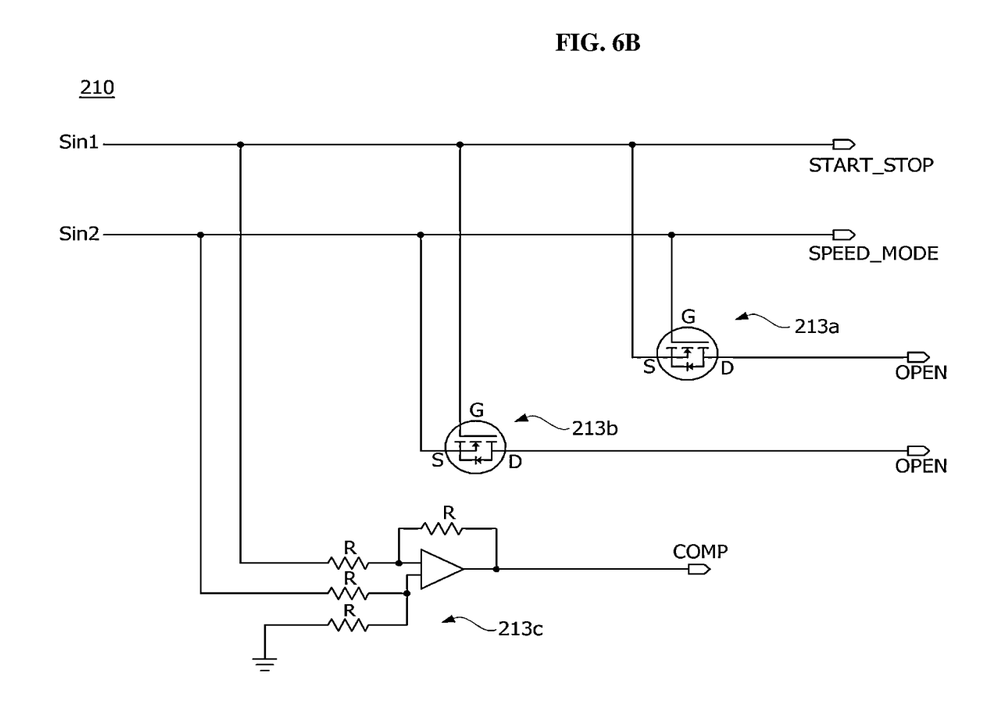
Figure 6C:
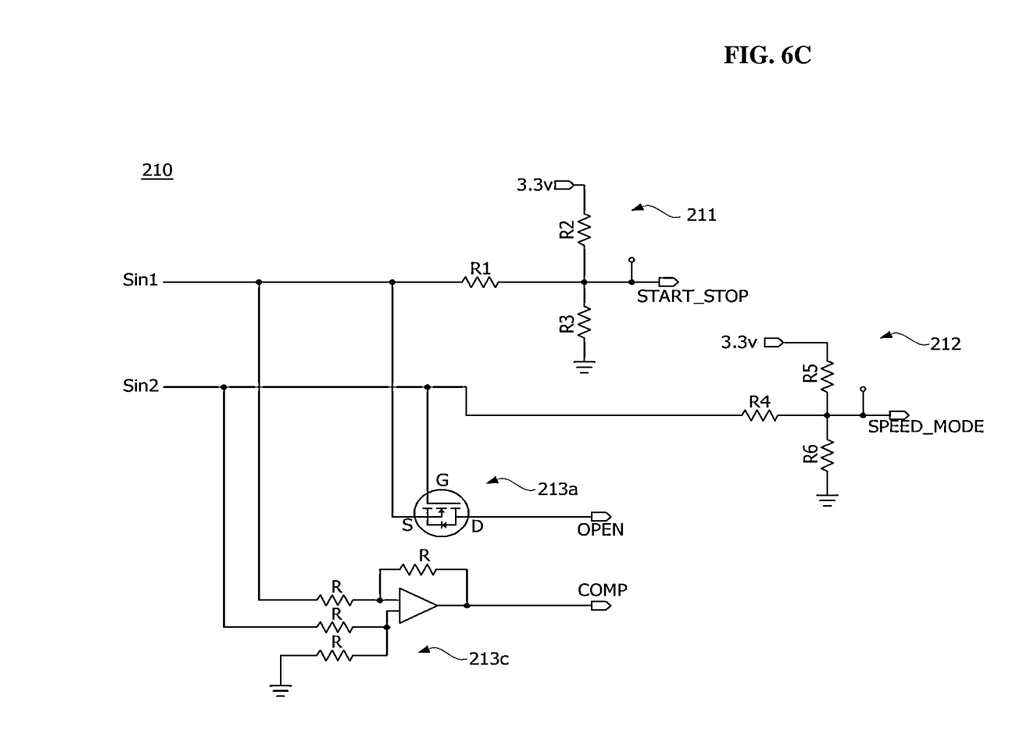

FIG. 5 is a view illustrating a configuration of a circuit part according to one embodiment of the present invention, and FIGS. 6A to 6C are views for describing a circuit in which the circuit part illustrated in FIG. 5 is implemented.

Referring to FIG. 5, a circuit part 210 according to one embodiment of the present invention may include a first reception circuit 211, a second reception circuit 212, and a sensing circuit 213.

The first reception circuit 211 may include a first resistor R1, a second resistor R2, and a third resistor R3, and the second reception circuit 212 may include a fourth resistor R4, a fifth resistor R5, and a sixth resistor R6.

The sensing circuit 213 may be disposed between and connected to a first signal line and a second signal line and may detect whether the first signal line and the second signal line are opened, or a first input signal and a second input signal are abnormal.

Referring to FIG. 6A, the sensing circuit 213 according to the embodiment may include a first sensing circuit 213a and a second sensing circuit 213b, the first sensing circuit 213a may detect whether the second signal line is opened, and the second sensing circuit 213b may detect whether the first signal line is opened.

The first sensing circuit 213a and the second sensing circuit 213b are implemented using, for example, an n-channel metal oxide semiconductor field effect transistor (MOSFET), but are not necessarily limited thereto.

A gate of the n-channel MOSFET of the first sensing circuit 213a is connected to the second signal line, a source of the n-channel MOSFET is connected to the first signal line, and the gate serves to turn the n-channel MOSFET on/off. Accordingly, when the second input signal, which is transmitted along the second signal line, is input to the gate, since the first input signal being transmitted along the first signal line is transmitted to a drain through the source, a value of "1" is output through a terminal OPEN. However, when the second signal line is opened, and the second input signal is not input to the gate, since the first input signal being transmitted along the first signal line is not transmitted to the drain through the source, a value of "0" may be output through the terminal OPEN.

Accordingly, when the value of "0" is output from the first sensing circuit 213a, an MCU may recognize that the second signal line is opened.

A gate of the n-channel MOSFET of the second sensing circuit 213b is connected to the first signal line, a source of the n-channel MOSFET is connected the second signal line, and the gate serves to turn the n-channel MOSFET on/off. Accordingly, when the first input signal being transmitted along the first signal line is input to the gate, since the second input signal being transmitted along the second signal line is transmitted to a drain through the source, a value of "1" is output through a terminal OPEN. However, when the first signal line is opened, and the first input signal is not input to the gate, the second input signal being transmitted along the second signal line is not transmitted to the drain through the source, and a value of "0" may be output through the terminal OPEN.

Accordingly, when the value of "0" is output from the second sensing circuit 213b, the MCU may recognize that the first signal line is opened.

Referring to FIG. 6B, a sensing circuit 213 according to an embodiment may include a first sensing circuit 213a, a second sensing circuit 213b, and a third sensing circuit 213c, the first sensing circuit 213a may detect whether a second signal line is opened, the second sensing circuit 213b may detect whether a first signal line is opened, and the third sensing circuit 213c may detect whether the first input signal and the second input signal are abnormal.

Since configurations and functions of the first sensing circuit 213a and the second sensing circuit 213b are the same as those of FIG. 6A, the configurations and the functions will not be described.

The third sensing circuit 213c may be implemented using an operational (OP) amplifier serving as a comparator and a subtractor. The third sensing circuit 213c is implemented using, for example, an inverting amplifier but is not necessarily limited thereto.

In the inverting amplifier of the third sensing circuit 213c, the first signal line may be connected to an inverting (−) input terminal, the second signal line may be connected to a non-inverting (+) input terminal, and a value difference between the first input signal being transmitted along the first signal line and the second input signal being transmitted along the second signal line may be output through a terminal COMP.

In this case, when the value difference between the first input signal and the second input signal is "0" or within an error range, it may be recognized that both the first input signal and the second input signal are normal signals. For example, the error range may be set to 3.3 V±5% based on an input signal at 3.3 V.

However, when the value difference between the first input signal and the second input signal is not "0" or is beyond the error range, it may be recognized that the first input signal or the second input signal is an abnormal signal.

In this case, the abnormal signal may include a lower voltage signal or a higher voltage signal than a signal at a reference voltage level of 3.3 V.

Referring to FIG. 6C, a sensing circuit 213 according to an embodiment may include a first sensing circuit 213a and a third sensing circuit 213c, the first sensing circuit 213a may detect whether a second signal line is opened, and the third sensing circuit 213c may detect whether a first input signal and a second input signal are abnormal.

Since configurations and functions of the first sensing circuit 213a and the third sensing circuit 213c are the same as those of FIG. 6B, description will be omitted here.

When an MCU 220 receives the first input signal and the second input signal from a circuit part 210, the MCU 220 may drive a driving motor on the basis of the first input signal and the second input signal.

The MCU 220 may receive a state output value from the circuit part 210, determine whether the first input line or the second input line is opened on the basis of the received state output value, and feed error information Senor back when the first input line or the second input line is in an open state according to the determination result.

The MCU 220 may receive a comparison output value from the circuit part 210, determine whether the first input signal or the second input signal is abnormal on the basis of the received comparison output value, and feed error information Serror back when the first input signal or the second input signal is determined to be an abnormal signal.

As in the above-described embodiments, whether input signals are changed or whether the input signals are abnormal due to an opened state of the signal lines can be accurately distinguished and determined through the configuration of the sensing circuit, and states and an abnormality of two signals can be detected using redundancy of the two signals.

Figure 7:
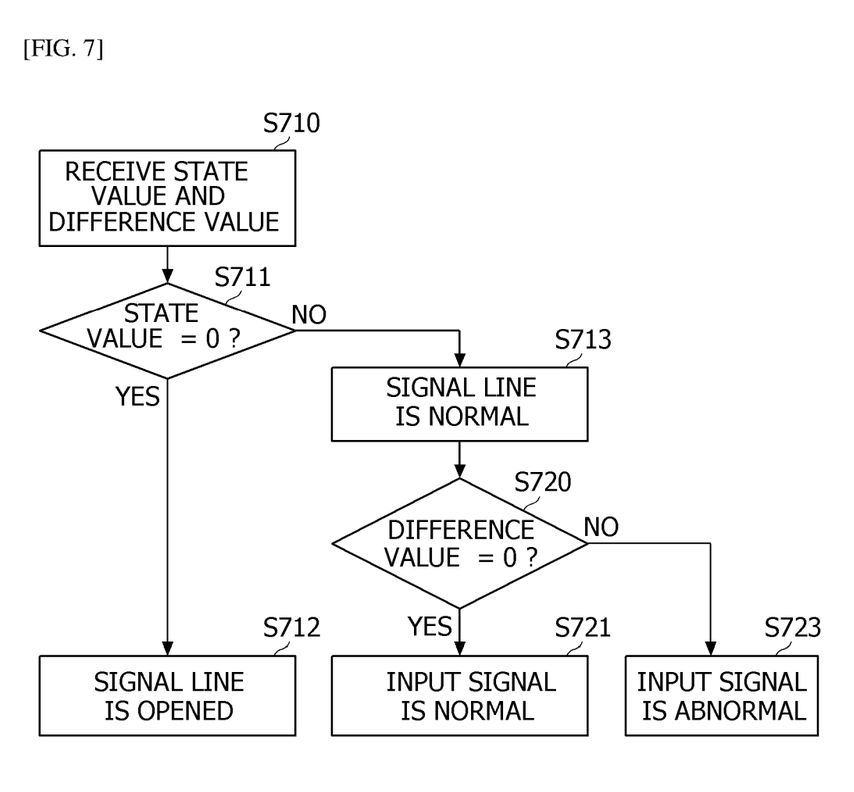
FIG. 7 is a view illustrating a fault diagnosis method according to one embodiment of the present invention.

FIG. 7 is a view illustrating a fault diagnosis method according to one embodiment of the present invention.

Referring to FIG. 7, in a motor control device according to the embodiment, when an MCU receives a state output value and a comparison output value from a circuit part connected to a first signal line and a second signal line (S710), the MCU may check whether the state output value is "0" or within an error range (S711).

Then, when the state output value is "0" or within the error range, the MCU may determine that the corresponding signal line is in an open state (S712).

For example, as in FIG. 6B, when one state value is received, and the state output value received from a sensing circuit is "0" or within the error range, the MCU determines that the second signal line is in an open state.

Then, when the state output value is not "0" or is beyond the error range, the MCU may determine that the corresponding signal line is in a normal state (S713) and check whether a value difference is "0" (S720).

Then, when the comparison output value is "0," the MCU may determine that an input signal is a normal signal (S721). In this case, the input signal may include both a first input signal and a second input signal.

However, when the comparison output value is not "0," the MCU may determine that the first input signal or the second input signal is an abnormal signal (S723).

Terms such as "unit" used in the present embodiment refer to software or a hardware component such as a field-programmable gate array (FPGA) or an application-specific integrated circuit (ASIC), and objects termed "unit" perform certain roles. However, the term "unit" is not limited to software or hardware. A "unit" may be configured to reside on an addressable storage medium or to reproduce one or more processors. Thus, in an example, the term "unit" includes components such as software components, object-oriented software components, class components, task components, processes, functions, properties, procedures, subroutines, segments of program code, drivers, firmware, micro-code, circuits, data, databases, data structures, tables, arrays, and variables. Functions provided by these components and "units" may be combined into a smaller number of components and "units" or may be subdivided into additional components and "units." Furthermore, the components and "units" may also be implemented to reproduce one or more central processing units (CPUs) within a device or a security multimedia card.

While the present invention has been described above with reference to exemplary embodiments, it may be understood by those skilled in the art that various modifications and changes of the present invention may be made within a range without departing from the spirit and scope of the present invention defined by the appended claims.

REFERENCE NUMERALS

100: ECU
200: MOTOR CONTROL DEVICE
210: CIRCUIT PART
220: MCU
230: DRIVING MOTOR

The invention claimed is:
1. A motor control device comprising:
a first reception circuit which receives a first input signal through a first signal line;
a second reception circuit which receives a second input signal through a second signal line;
a sensing circuit which is connected to the first signal line and the second signal line and outputs a state output value which varies according to whether the second signal line is opened; and
a micro control unit (MCU) which receives the state output value output from the sensing circuit and deter- mines whether the second signal line is opened using the received state output value, wherein the sensing circuit is not connected to the first signal line when the second signal line is opened and outputs "0" as the state output value, and is connected to the first signal line when the second signal line is not opened and outputs "1" as the state output value.

2. The motor control device of claim 1, wherein:
the sensing circuit includes an n-channel metal oxide semiconductor field effect transistor (MOSFET);
a gate of the n-channel MOSFET is connected to the second signal line; and
a source of the n-channel MOSFET is connected to the first signal line.

3. The motor control device of claim 1, wherein the sensing circuit includes:
a first sensing circuit which is connected to the first signal line and the second signal line and outputs a state output value which varies according to whether the second signal line is opened; and
a second sensing circuit which is connected to the first signal line and the second signal line and outputs a state output value which varies according to whether the first signal line is opened.

4. The motor control device of claim 1, wherein the sensing circuit includes:
a first sensing circuit which is connected to the first signal line and the second signal line and outputs a state output value which varies according to whether the second signal line is opened; and
a second sensing circuit which is connected to the first signal line and the second signal line and outputs a comparison output value between the first input signal and the second input signal.

5. The motor control device of claim 4, wherein the second sensing circuit outputs:
"0" or a value within a predetermined error range as the comparison output value when both the first input signal and the second input signal are normal signals; and
a value other than "0" or a value beyond the predetermined error range as the comparison output value when the first input signal or the second input signal is an abnormal signal.

6. The motor control device of claim 4, wherein:
the second sensing circuit includes an inverting amplifier;
the first signal line is connected to an inverting input terminal of the inverting amplifier;
the second signal line is connected to a non-inverting input terminal of the inverting amplifier; and
the second sensing circuit outputs the comparison output value between the first input signal and the second input signal.

7. The motor control device of claim 1, wherein the sensing circuit includes:
a first sensing circuit which is connected to the first signal line and the second signal line and outputs a state output value which varies according to whether the second signal line is opened;
a second sensing circuit which is connected to the first signal line and the second signal line and outputs a state output value which varies according to whether the first signal line is opened; and
a third sensing circuit which is connected to the first signal line and the second signal line and outputs a comparison output value between the first input signal and the second input signal.

8. The motor control device of claim 1, wherein:
the first input signal is a voltage signal for waking the MCU up; and
the second input signal is a voltage signal for controlling a speed of a driving motor.

9. A fault diagnosis method of a motor control device, comprising:
receiving a state output value, which varies according to whether a second signal line is opened, from a reception circuit connected to a first signal line and the second signal line to which a first input signal and a second input signal are applied;
receiving a comparison output value between the first input signal and the second input signal from a sensing circuit connected to the first signal line and the second signal line; and
determining whether the second signal line is opened using the received state output value, and determining whether the first input signal or the second input signal is abnormal using the received comparison output value,
wherein the sensing circuit is not connected to the first signal line when the second signal line is opened and outputs "0" as the state output value, and is connected to the first signal line when the second signal line is not opened and outputs "1" as the state output value.

* * * * *